United States Patent [19]

Marshall

[11] Patent Number: 4,695,788
[45] Date of Patent: Sep. 22, 1987

[54] OPEN FAULT LOCATION SYSTEM FOR PHOTOVOLTAIC MODULE STRINGS

[75] Inventor: Neil A. Marshall, Rancho Palos Verdes, Calif.

[73] Assignee: Hughes Aircraft Company, Los Angeles, Calif.

[21] Appl. No.: 680,451

[22] Filed: Dec. 11, 1984

[51] Int. Cl.$^4$ ........................ G01R 31/08; H01L 31/00
[52] U.S. Cl. ............................... 324/527; 324/158 D; 136/290
[58] Field of Search .................. 324/51, 54, 52, 158 D, 324/158 R, 73 PC, 73 R, 67; 136/290; 250/562, 559; 73/DIG. 11; 179/175.3 F; 455/67, 226, 296; 379/26

[56] References Cited

U.S. PATENT DOCUMENTS

| | | | |
|---|---|---|---|
| 3,991,363 | 11/1976 | Lathrop | 324/67 X |
| 4,072,899 | 2/1978 | Shimp | 455/67 X |
| 4,085,366 | 4/1978 | Padgett | 455/296 X |
| 4,413,229 | 11/1983 | Grant | 455/67 X |

OTHER PUBLICATIONS

High Energy, Inc.
Hewlett-Packard, Automatic Pair Identifier, 4960A/4961A.
Hewlett-Packard, Automatic Pair Identifier, 4960B/4961B.
Hewlett-Packard, Conductor Fault Locator, 4930A.
Hewlett-Packard, The HP Open Line, Nov. 1979.
Hewlett-Packard, Cable Fault Locator, 4904A.
Hewlett-Packard, Open and Split Fault Locator, 4910G, Technical Data 11/15/78.
Avantek, Data Sheet CR/CT-4000, 5 to 440 MHz (58 channel) Low Level Sweep System, revised Jul. 1981.
Avantek, Data Sheet, Signal Level Meter SL 450; 4.5 to 450 MHz, revised Jul. 1983.
Avantek, Data Sheet, CA-100B CATV Cable Analyzer, Sept. 1981.
3M, Network Products, Test and Measurement Systems.
3M, Maintenance Products, Test and Measurement Systems.
Biddle, Electrical Testing Instruments for Industry, Bulletin 19-84d.
Biddle, Cable Fault Locating Equipment, Bulletin 65d.

Primary Examiner—Gerard R. Strecker
Assistant Examiner—Jack B. Harvey
Attorney, Agent, or Firm—Robert Thompson; A. W. Karambelas

[57] ABSTRACT

A radio frequency (rf) probing technique is disclosed for determining whether an rf signal injected into one termination of a series-connected string of photovoltaic (PV) modules has been conducted to successive positions in the string. A signal generator is provided for generating a carrier signal which is modulated by an audio frequency tone. The generator is capacitively coupled to one of the terminations of the module string to inject the modulated carrier signal into the string. A receiver is tuned to the carrier frequency and adapted to demodulate the audio tone. Rf signals are coupled to the receiver by a probe including a shielded plate electrode, which may be disposed adjacent the active surfaces of successive ones of the modules in order to detect the presence or absence of the rf signal at that point in the string. An alternate technique is disclosed, whereby a measurement of the capacitance-to-ground of the string is compared against a reference capacitance value of a fault-free system.

26 Claims, 7 Drawing Figures

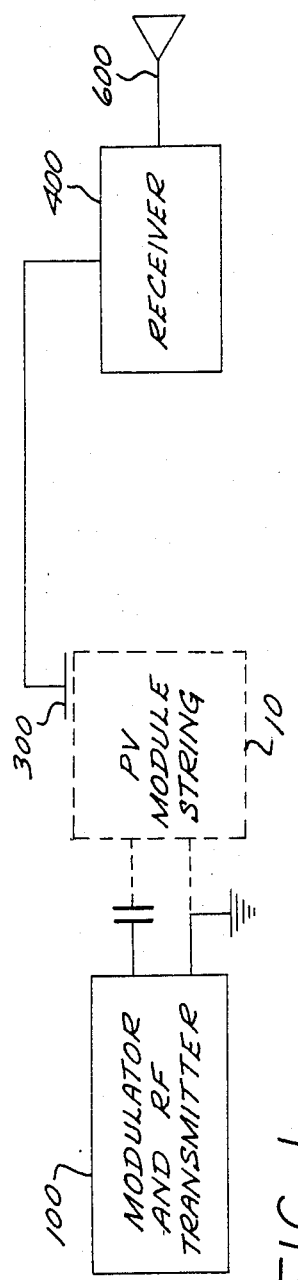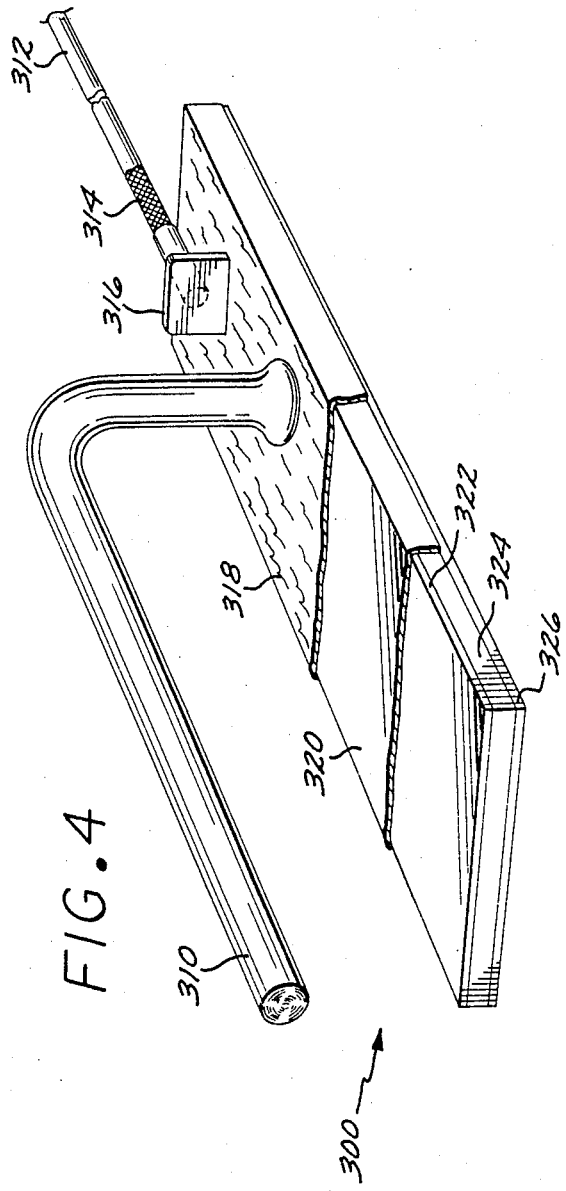

OPEN FAULT LOCATION SYSTEM FOR PHOTOVOLTAIC MODULE STRINGS

BACKGROUND OF THE INVENTION

The present invention relates to fault detection systems for photovoltaic module systems.

Solar or photovoltaic (PV) energy conversion is presently used in a wide range of applications. Typically, a number of solar cells are connected together to provide practical voltage (for example, 5 to 15 VDC) and power output levels and are packaged in a protective enclosure to form a PV module. PV modules are available in many shapes and sizes from number of commercial sources.

Intermediate sector photovoltaic power systems, i.e., those with power ratings to several megawatts, are typically utility interactive. For these systems, power efficiency dictates DC bus voltages in the range of 400–1000 VDC. That requires a large number of 5 to 15 VDC photovoltaic modules arranged in series-connected strings.

A photovoltaic module within a series string has two basic failure modes, "short/bypass" and "open". A module shorted or in bypass contributes no power. The affected string, with one or more of its series voltage generating elements malfunctioned, is unable to deliver full, or possibly any power to the bus. A practical diagnostic procedure involving sequential and selective isolation masking exists for identifying the location of a module with that type of failure.

The second failure mode is characterized by a complete loss of power from the string, i.e., an infinite string impedance as the result of an open circuit or total disconnect. The system power loss in the event of an open circuit is a function of both the number of modules in series as well as their output current. In one system in use today, the Georgetown University PHENEF system rated at 300 KWpk, there are 124 bipolar strings of two monopoles each (plus and minus). Each monopole in turn consists of 18 series-connected PV modules rated at 72 watts, each module measuring two feet by four feet. The modules are flat units which are mounted onto the roof of the building. For this system, loss of a module due to an open circuit causes loss of the output of the entire monopole string, resulting in a peak output power loss for the entire system of about 0.4%.

The consequence of repair on a "walk-on" photovoltaic roof structure, without first having identified the location of the fault, can be serious, because the photovoltaic modules actually form part of the roof structure. In the Georgetown example, 4464 photovoltaic modules actually form the curtain-wall-type structure similar to an atrium glass roof. Up to 18 modules in the string might have to be removed from their sealing frames, and additionally, an equal number of adjacent modules would be disturbed. There is also a real probability of introducing roof leaks.

In circumstances where the back side of the array is accessible and the module interconnections can be conveniently reached from the rear (i.e., shaded side) of the modules, open circuit fault isolation can be accomplished by progressive check of the jumpers, the module receptacles and the mating plugs. As the array dimensions grow, even this direct contact method becomes more unsafe and time consuming because the maintenance technician is required to make checks when potentially hazardous voltages and currents are being generated, i.e., when there is solar radiation incident on the modules. The method also unnecessarily exercises the connectors, which could lead to unreliability.

For array elements installed directly on existing roofs (and with inaccessible intra-string wiring), and for installations where the modules form the final roof above a subroof, no suitable technique is available for pinpointing the location of open circuit faults within a module string. In such a "back sealed" (back inaccessible) roof-top installation, it is virtually impossible to precisely locate an "open" module fault, or a module-to-module open circuit without physically removing all or part of an entire module string. This is costly, results in loss of energy conversion availability, (i.e., "downtime") and can lead to secondary failures.

One solution to the problem may be the use of fault indicators or test points which are built into the modules. That solution would increase the cost of the modules, would be susceptible to failure, and would drain power from the system, thereby reducing its efficiency.

SUMMARY OF THE INVENTION

The present invention provides an open fault detection system for detecting the location of open circuit type faults in a series-connected string of PV modules. A radio frequency probing technique is used to determine whether a radio frequency signal injected into the output termination of a PV module string has been conducted to probed locations in the string. In accordance with one embodiment of the invention, a transmitter generates an rf frequency carrier which is amplitude modulated by an audio frequency tone. In alternative embodiments, a wave (angle) modulated carrier, such as phase or FM, signal may be used. The transmitter output is coupled to the output termination of the module string by an injection probe which injects the modulated carrier signal into the module string.

A receiver is provided to demodulate and detect the audio tone from the carrier signal. In one embodiment, the receiver output is coupled to a speaker or headphone to provide an audio indication of the detected signal. In another embodiment, an autoranging digital panel meter may be used to receive and display the proportional signal (e.g., probe distance v. signal strength). A probe coupled to the receiver input is an insulated plate electrode. When the probe is placed near a PV module, the effective capacitance between the probe electrode and the module couples the injected rf signal to the receiver input. The operator is able to locate open circuit faults by successively placing the probe over respective ones of the string, and listening for the presence (or absence) of the detected tone. A ground return path (or reference) is provided by a ground wire clipped to any convenient metallic structure element. In some situations the capacity of the operator to ground will suffice.

It is therefore an object of the present invention to provide an open fault detection system for PV module strings.

Another object of the invention is to provide a system for detecting the location of open faults in PV module strings which does not require the disassembly or disconnection of the PV module string.

Another object of the invention is to provide an open fault detection system for PV module strings which employs a detector apparatus easily carried by an operator.

Yet another object of the invention is to provide an inferential (parametric) technique for resolving the location of open faults in PV module strings below the monopole level.

A further object of the invention is to provide an open fault detection system for PV module strings which is reliable, safe to operate, and relatively inexpensive to manufacture.

Still another object of the invention is to provide apparatus for detecting open faults in a series-connected string of photovoltaic (PV) modules comprising means for impressing rf signals onto said module string and means for detecting such rf signals, said detecting means comprising probe means for coupling rf signals from said modules to the detection means.

A still further object of the invention is to provide apparatus for open fault detection in a string of series-connected PV modules comprising an rf generator adapted to be coupled to the PV module string to inject an rf signal into the string, a portable rf receiver comprising means for detecting said rf signal injected into the module string, and an rf probe member adapted to couple rf signals from the module string to the receiver.

Yet another object of the invention is to provide a method for detecting open faults in a series-connected string of photovoltaic (PV) modules comprising injecting a radio frequency (rf) signal into the PV module string and detecting the presence or absence of the rf signal at successive locations along the PV module string.

A further object of the invention is to provide a method for detecting open faults in a series-connected photovoltaic module string, comprising providing a reference value for the capacitance-to-ground of the PV module string in a fault-free condition, measuring the capacitance of the module string to obtain a measuremet capacitance value, and comparing the measured capacitance value to the reference capacitance value.

A still further object of the invention is to provide apparatus for detecting open faults in a series-connected photovoltaic (PV) module string, comprising an rf signal generator adapted to generate an rf carrier signal which is amplitude modulated by an audio frequency signal, connection means for electrically connecting the rf signal generator to the module string to inject the modulated rf carrier into the module string, receiver means tuned to the frequency of the rf carrier and comprising demodulator means for demodulating the audio frequency signal, and audio transducer means coupled to the demodulator means for providing audio signals in response to the demodulator output, and probe means coupled to the receiver means comprising shielded electrode means adapted to capacitively couple rf signals to the receiver input when the electrode means is disposed adjacent a PV module of the string, whereby the audio signals provide an indication whether the rf signals have been conducted to the module adjacent the probe location.

These and other and further objects and features and advantages of the invention will become apparent from the above and below specification and claims and drawings.

BRIEF DESCRIPTION OF THE DRAWINGS

FIG. 1 is a simplified block diagram of the major components of one embodiment of the invention.

FIG. 4 is a perspective cutaway view of the probe employed in the embodiment of FIG. 1.

DETAILED DESCRIPTION OF THE INVENTION

Figure 2:
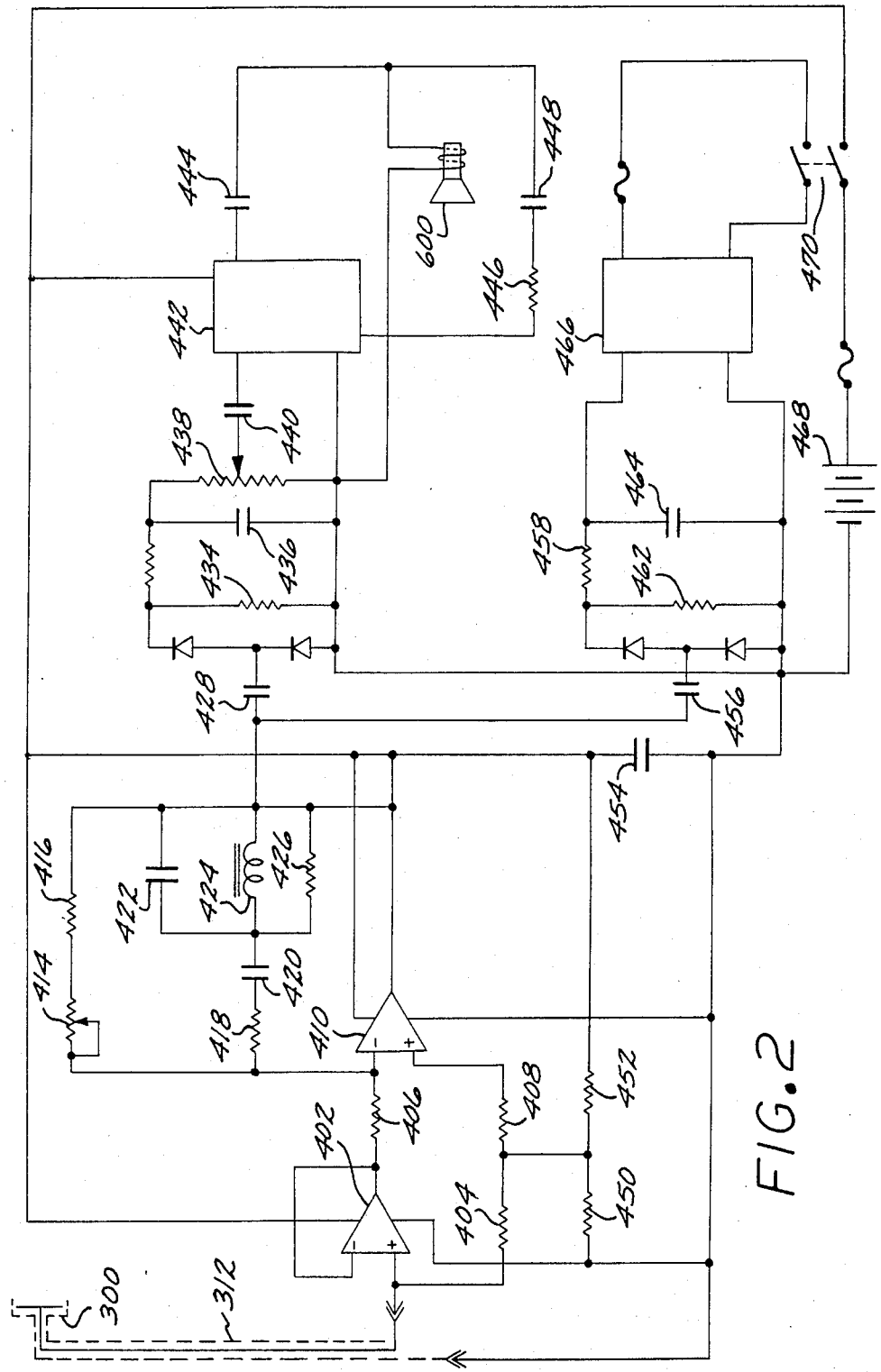
FIG. 2 is a schematic diagram of the receiver employed in the embodiment of FIG. 1.

The present invention provides an open fault detection system for PV module strings. The following description is presented to enable any person skilled in the art to make and use the invention, and is provided in the context of a particular application, and its requirements. Various modifications to the disclosed embodiments will be readily apparent to those skilled in the art, and the generic principles defined herein may be applied to other embodiments and applications. Thus, the present invention is not intended to be limited to the embodiments shown, but is to be accorded the widest scope consistent with the principles and novel features disclosed herein.

The present invention is directed to determining the location of "open" faults within a PV module string. The invention provides a positive, rapid, and unambiguous method for precisely locating an electrically "open" module or a broken or disconnected jumper connector between PV modules in the string.

In accordance with the invention, a radio frequency (rf) probing technique is used to determine whether an rf signal injected into the termination of the PV module string has been conducted to probed points in the serial "daisychained" circuit.

A preferred embodiment of the invention is generally illustrated in the simplified block diagram of FIG. 1. A modulator and rf transmitter 100 is capacitively connected to the output termination of the PV module string 10 undergoing test. Typically, the termination is conveniently available at a terminal board located in an electrical closet or the like. The transmitter may be adapted to generate, for example, a 100 KHz carrier signal which is amplitude modulated by a 1 KHz tone. The AM modulated carrier signal is injected into the PV module string via the capacitive coupling.

A receiver 400 is coupled to a probe 300 which is a shielded electrode, i.e., one-half of a flat plate capacitor. The receiver is tuned to demodulate and detect the AM modulated rf carrier signal generated by transmitter 100. An operator carrying the probe and receiver successively positions the probe over each PV module in the string, commencing with the module adjacent the string output termination. The receiver output may be coupled to speaker 600 so that the operator receives an audio indication of the presence (or absence) of the modulated tone. As soon as a position is found at which no tone is heard, the location of the fault has been found. It is understood that other types of indications, such as warning lights or visual meter displays, may be provided in addition to or in place of the speaker, with appropriate signal and circuit modifications, without departing from the present invention.

Figure 3:
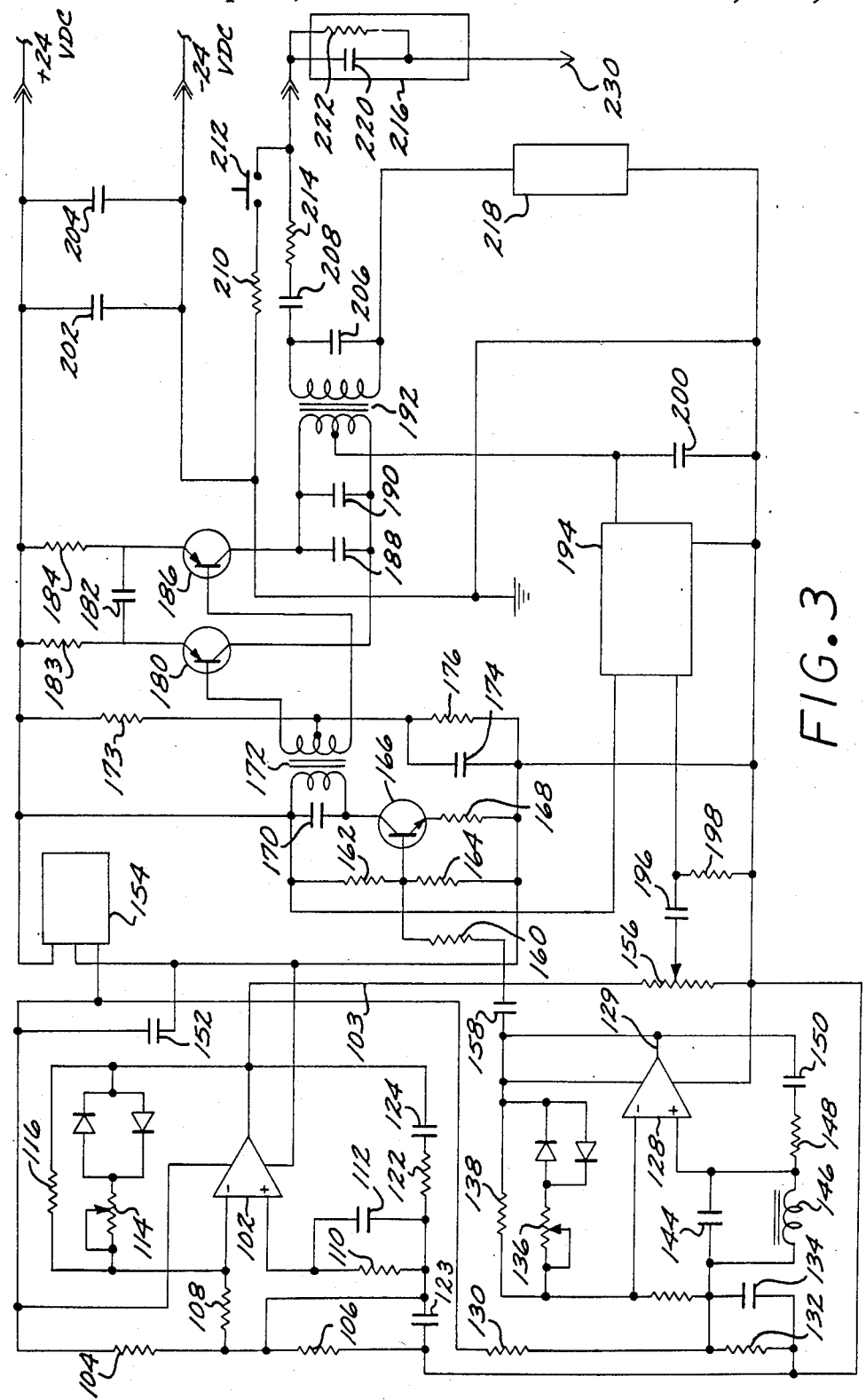
FIG. 3 is a schematic diagram of the transmitter employed in the embodiment of FIG. 1.

Schematic drawings of the receiver 400 and transmitter 100 are shown in FIGS. 2 and 3, respectively.

Referring first to FIG. 2, the probe 300 is coupled via cable 312 to the noninverting input of an operational amplifier 402. The amplifier 402 is set up as a voltage follower, whose very high impedance permits the probe 300 to develop a full signal. The output of the amplifier 402 is coupled through a resistor 406 to the inverting input of a second operational amplifier 410. The probe signal is also coupled through resistors 404 and 408 to the non-inverting input of amplifier 410.

The amplifier 410 is a tuned operational amplifier having a typical throughput dc gain of about 24. The gain level is merely illustrative and is not critical to the present invention. A resistor 418, capacitors 420 and 422 and an inductor 424 form a peaking feedback network which results in a limiting high frequency gain of about 6 at a signal input frequency of 1 MHz for the purpose of suppressing detection of radio stations. Again, the gain level is not critical. Further reduction of RFI is achieved by use of the shielded probe described later, which inhibit detection of the magnetic vector of broadcast electromagnetic fields typically detected by a radio receiver having a ferrite loop-stick antenna. The capacitor 420, with a nominal value of about 500 nanofarads, has a sufficiently low reactance at 60 Hz (4 KOhms) to suppress the low frequency gain. The combination of the very low coupling capacity of the probe 300 and the low reactance of the capacitor 420 makes the detector virtually immune to orindary 60 Hz fields.

The capacitor 422, inductor 424, and resistor 426 form an antiresonant (parallel resonant) tank network tuned to about 100 KHz (the carrier frequency of the transmitter). Assuming a network Q of about 10 (which is not a critical value), the effective tank impedance is about 600 KOhms at resonance. Consequently, the amplifier 410 peaks at resonance, rejecting unwanted high and low frequency components.

The receiver demodulator or audio detector comprises a conventional asymetrical voltage doubler with an output time constant $T_{RC}$ of about 0.5 milliseconds. The time constant can be somewhat greater without causing 60 Hz demodulation. The output from the amplifier 410 is coupled into an input of an LM380 wideband audio amplifier chip 442. The chip can deliver typical output power of about 2 watts. The output of the chip 442 drives an audio speaker 600.

The receiver also includes a visual indicator of the received signal. The visual indicator is an autoranging digital multi-meter 466 marketed by Beckman Instruments under the brand name "Circuit Mate," set on the DC mode. The multi-decade autoranging capability simulates a logarithmic response. A visual annunciator may be substituted for the multimeter, such as a comparator triggered daylight visible light that will turn on above a predetermined threshold.

The receiver is powered by a 12 volt battery 468.

Referring now to FIG. 3, the transmitter 100 is adapted to provide a 100 KHz carrier, amplitude modulated by a 1 KHz audio tone. Operational amplifier 128 is a high frequency oscillator which generates the transmitter carrier signal. A resonant tank circuit capacitor 144 and inductor 146 causes the amplifier to generate the desired carrier frequency.

The 100 KHz output 129 of the carrier oscillator circuit is coupled through a capacitor 158 and resistor 160 to a transistor amplifier 166. The output of the transistor amplifier drives a push-pull power stage through a tuned transformer 172 having ferrite pot core. The push-pull amplifier includes transistors 180 and 186. The output of the power stage is coupled to the primary winding of a tuned transformer 192.

An operational amplifier 102 serves as the active device in an RC (or phase shift) low frequency oscillator. The two pole response characteristics in the positive feedback loop of the amplifier results in a monotonic value of the frequency of oscillation at about 1 KHz. That is not a particularly demanding circuit requirement, the gain and I/O isolation of the amplifier 102 resulting in a stable non-critical oscillator that will reliably generate the required tone. The output of the oscillator 102 is coupled via line 103 to an audio amplifier 194 and the secondary winding of the tuned transformer 192.

The amplifier 194 is a type LM 380 audio amplifier, which functions as a power modulator. The output of the amplifier 194 is coupled to the center tap of the transformer 192. With the transformer 192 driven in the manner disclosed in FIG. 3, the amplified carrier signal is amplitude modulated by the 1 KHz signal. That type of power modulation is analogous to "Heising" or "plate" AM modulation used in standard AM broadcasting. Such AM techniques are well known in the art and, for example, are discussed in the book "Information Transmission, Modulation, and Noise," by Mischa Schwartz, Second Edition, 1970, McGraw-Hill, Inc., pages 212–213. Other AM, as well as FM or other wave modulated techniques may readily be substituted for the disclosed circuitry.

In amplitude modulation of an RF carrier, the carrier power at full modulation ($M_a$=unity) is 1.5 times the unmodulated carrier output power. Thus, if one watt of carrier signal is to be injected, the modulator power should be 500 milliwatts. Typically, the desired carrier level is in the range of 5 to 15 VRMS, and the injected carrier power is in the range of 1 to 3 watts. With proper selectivity and sensitivity, the power requirement can be reduced to about 100 milliwatts.

The modulated carrier signal is capacitively coupled to an injection probe and carrier injection network 216. In the disclosed embodiment, a double insulated (redundant) carrier injection network is employed. The output circuit can be considered as a network of series and parallel connected capacitors, in turn in series with an inductance and a resistor. The parallel capacitance is that of the isolated PV modular array elements and wiring to ground, which is in series with the blocking capacitor. The inductance is that of the secondary winding of the driver transformer 192. The high voltage blocking capacitor 220 is sized for safe monopolar operation at 1,000 VDC, considerably in excess of any monopolar voltage presently used. In addition, the secondary of the driver (output) transformer 192 is wound with teflon insulated wire, with a dielectric breakdown voltage in excess of 5 KVDC.

System safety is enhanced by housing the coupling capacitor 220 in a high voltage probe 216 outfitted with an insulated retractable clamp 230 to permit the operator to safely couple the transmitter to a high voltage DC generator. A 20 Megohm, 2 kV, shunting resistance 222 is connected across the blocking capacitor to provide about a 2 second discharge time constant with a 100 nanofarad capacitor to protect the operator from electrical shocks from the coupling capacitor 220. The transmitter is coupled to the output termination of the PV module string, typically at a terminal board located in an electrical closet, and is also coupled to the system ground. A current sensing monitor 218 is provided to sense the rf current flow injected into the module string to indicate that the transmitter is working and is properly connected to the string.

The transmitter is powered by a ±24 VDC power supply which may be either a battery supply or may be developed from alternating line current by use of a converter circuit. Line power is not preferred because of the possibility of false signals caused by unwanted high frequency paths into the power lines. The supply voltage is regulated by a three terminal regulator 154 for stable, mono-frequency oscillator operation.

The carrier frequency of 100 KHz is a design choice. Other frequencies may be selected to suit individual needs and requirements. However, an audio frequency carrier less than 20 KHz should not be used because the reactive loss of such a low frequency signal through the glass enclosure of a module would generally be too great to permit sufficient transmission of electromagnetic energy for detection. Reactive loss is directly related to the frequency of the signal. The higher the frequency of the injected signal, the lower the reactance loss of the glass. However, if too high a frequency is used, the loss would be so low that the entire string would become an rf radiator and the operator would be unable to determine the location of the received signal and the system would be useless as an open fault detector. Thus, the carrier frequency must be high enough to avoid preclusion of sufficient energy transmission for signal detection, yet not so high that the array becomes a radiator precluding discrimination of the source of the received signal. While this range will obviously be dependent on the structure of the array, a carrier frequency in the range of 100–450 KHz provides satisfactory performance for the glass typically used to cover PV cells.

The following is a list of the components used in the receiver and transmitter circuits shown in FIGS. 2 and 3.

Receiver

Amplifiers 402,404—μA 741
Resistor 404—330 KOhm
Resistor 406—4.9 KOhm
Resistor 408—4.9 KOhm
Resistor 414—50 KOhm (pot.)
Resistor 416—75 KOhm
Resistor 418—27 KOhm
Capacitor 420—0.5 microfarads
Capacitor 422—87 picofarads
Inductor 424—33 millihenries
Resistor 426—100 KOhm
Capacitor 428—0.01 microfarads
Resistor 434—25 KOhm
Capacitor—0.002 microfarads
Resistor 438—10 KOhm
Capacitor 440—0.1 microfarad
Amplifier 442—Lm 380 IC Audioamp
Capacitor 444—0.01 microfarads
Resistor 446—27.2 KOhm
Capacitor 448—0.01 microfarad
Resistor 450—4.9 KOhms
Resistor 452—4.9 KOhms
Capacitor 454—4.7 microfarads/50 VDC Tantalum
Capacitor 456—0.001 microfarads
Resistor 458—1.8 microfarads
Resistor 462—6.8 KOhm
Capacitor 464—0.1 microfarad
Switch 470—DPST

Transmitter

Amplifiers 102,128—μA 741
Resistors 104, 106—2 KOhm
Resistors 110—20 KOhm
Capacitor 112—0.0033 microfarad
Potentiometer 114,136,156—0–5 KOhm
Resistor 116,138—50 KOhm
Resistor 122—20 KOhm
Capacitor 123—0.33 microfarad
Capacitor 124—0.0033 microfarad
Resistors 130,132—2 KOhm
Capacitor 144—500 picofarads
Inductor—0.5 millihenries
Resistor 148—1.0 KOhm
Capacitor 150—0.001 microfarad
Capacitor 152—10 microfarads/35 V
Regulator 154—MC78 M 20 C (Motorola)
Capacitor 158—3.6 microfarads
Resistor 160—5.0 KOhm
Resistor 162—50 KOhm
Resistor 164—10 KOhm
Transistor 166—2N 2270
Resistor 168—500 Ohm
Capacitor 170—500 picofarads
Transformers 172,192—Hughes Design—100 KHz Ferrite
Resistor 173—10 KOhm
Capacitor 174—0.5 microfarads
Resistor 176—50 KOhm
Transistor 180, 186—Motorola MPS457
Resistor 183—47 Ohm
Capacitor 182—4700 picofarads
Resistor 184—47 Ohm
Capacitor 188—0.5 microfarad/50 V
Capacitor 190—500 picofarads
Amplifier 194—LM 380
Capacitor 196—0.1 microfarad/50 V
Resistor 198—10 KOhm
Capacitor 200—0.22 microfarad
Capacitor 202—0.01 microfarad
Capacitor 204—10 microfarads/50 V
Capacitor 206—200 picofarads
Capacitor 208—0.1 microfarad
Resistor 210—25 KOhm
"Push-to-test" Switch 212—Type 8631Z Q
Resistor 214—1 KOhms
Capacitor 220—100 nanofarads
Resistor 222—20 megaohm The circuits described above are exemplary only. Other circuits may be readily designed to accomplish the described functions.

Referring now to FIG. 4, a perspective, partial cutaway view of the probe 300 is shown. The probe 300 comprises a 4-inch-by-10-inch-by-¼ inch rectangular aluminum bar electrode 324 electrically connected to the center conductor of coaxial cable 312. A handle 310 is provided to allow the operator to hold the probe during operation. Upper and lower insulating plates 322 and 326 disposed on the top and bottom of the electrode 324, are 1/16 inch sheets of polyethylene.

An aluminum foil shield 320 is wrapped around and affixed on all sides and the top surface of the probe 300. The bottom surface of the probe is left foil-free to form a probe window having approximate dimensions of about 3⅞ inch by 9⅞ inch.

An outer insulating sheath 318, fabricated from polyvinylchloride (PVC) or polyethylene, completely encloses the electrode. The sheath 318 prevents grounding hazards and provides additional isolation in a manner similar to the "double insulation" techniques used in electrical tools.

The rectangular shape of the probe electrode is not essential to the practice of the invention. Probes employing a circular electrode configuration (similar to a metal detector) have been constructed and found suitable in operation for the purpose.

Figure 5:
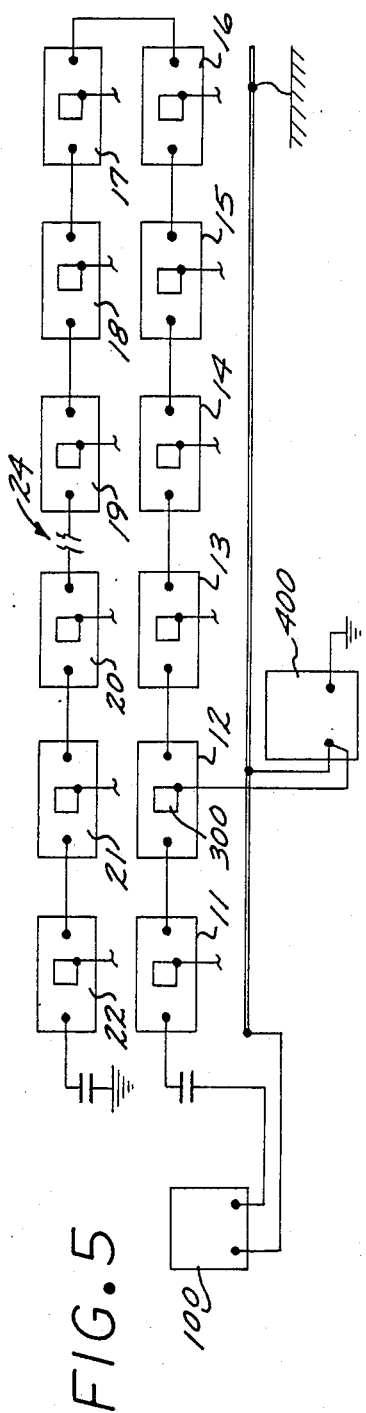
FIG. 5 is a general schematic illustration of a PV module string comprising twelve series-connected modules.

FIG. 5 is a schematic illustration of a module string comprising twelve series-connected modules 11–22. For illustrative purposes, an electrical break 24 is shown in the jumper cable connecting modules 19 and 20. The transmitter 100 is connected to the module string at the string termination via the interface probe to inject the AM modulated carrier signal into the module string.

For a "walk-on" roof mounted PV system, the operator, rigged with appropriate safety lines, then walks on the roof, testing for the modulated carrier by placing the probe on the respective module surfaces at successive test locations. Thus, for the PV module string shown in FIG. 5, the operator would first place the probe on the surface of PV module 11 and determine whether the 1 KHz tone is detected at this module. If the tone is detected at this module, the probe would then be positioned successively over modules 12, 13 . . . 22 until the detector fails to detect the tone above one of the modules. In FIG. 5, the detector should detect the tone when placed above each of modules 11–19, but no tone should be detected when the probe is located above modules 20–22 because of the break located in the jumper connecting modules 19 and 20. Thus, by sequentially testing each module, the operator can locate the position of the open fault in the module string.

Figure 6:
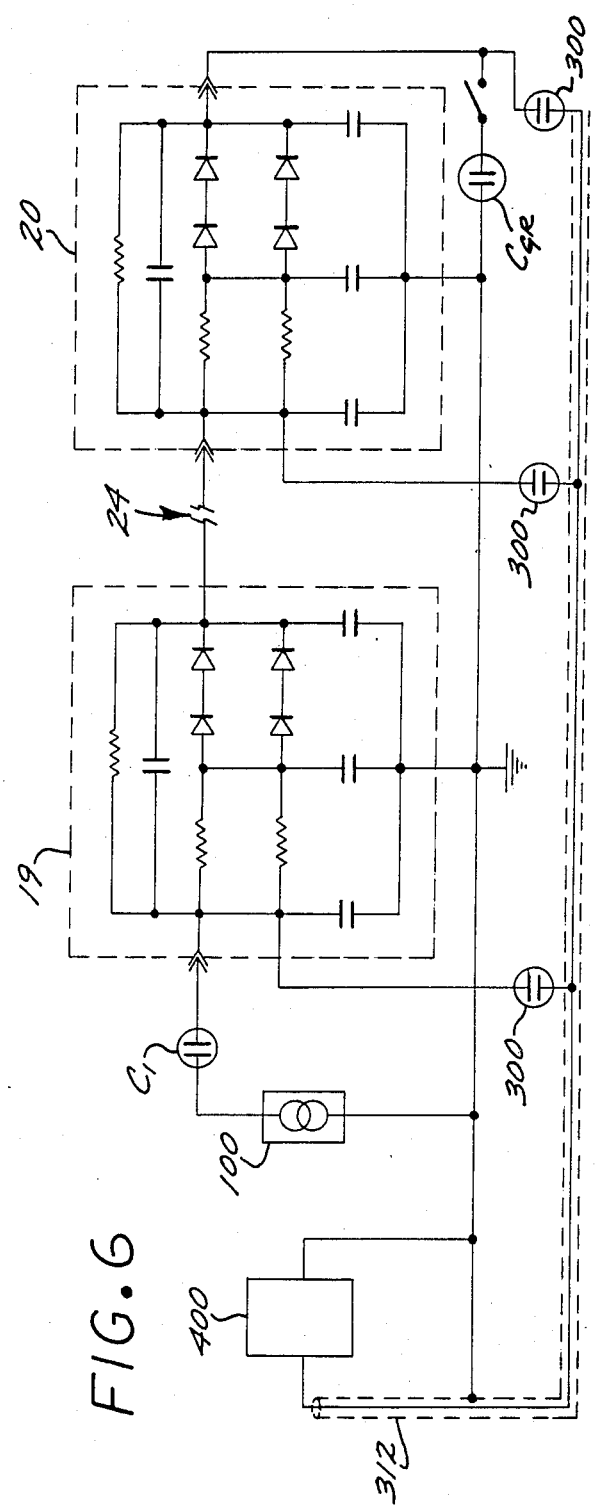
FIG. 6 is an electrical schematic depiction of two PV modules of a module string undergoing test in accordance with the invention.

FIG. 6 is an electrical schematic depiction of modules 19 and 20 undergoing test in accordance with the invention. Equivalent electrical circuits of the modules are respectively indicated within phantom lines 19 and 20. The break in the jumper cable connecting the modules is indicated by reference numeral 24. The probe is represented electrically by capacitance $C_p$. Three positions of the probe are shown with the phantom lines indicated by reference numerals 300.

In FIG. 6, a capacitor $C_1$ indicates the injection probe capacitor 220, which may typically be in the range of 20 to 50 microfarads at 500 VDC. Capacitor $C_{GR}$ represents the ground reference capacitance, also typically in the range of 20 to 50 microfarads at 500 VDC. The capacitance $C_p$ of the probe electrode to the typical PV wafer assembly (through the cover glass) is in the range of about 40 to 120 picofarads. For those values, the discrimination signal-to-noise ratio (SNR) is in the range of 22 to 35 db (13:1 to about 50:1), as a function of the noise and injection voltage.

The disclosed open fault detection system provides a rapid and positive open-fault diagnostic, requiring only access to the string terminations and the weather side of the PV modules. The system obviates the need for "built-in" failure detectors and/or test points, and does not require costly removal of installed modules on a one-by-one basis to find an open break. The system provides a safe detection system useful for steep walk-on roofs. A repairman in a safety harness, holding a light-weight probe and the receiver, can determine, for example, an open fault in seventy to one hundred running feet of modules almost as fast as his safety rigging will permit. A high detection threshold or discrimination ratio has been observed. The transition over an open break is positive and non-ambiguous.

Instead of using a tone-modulated carrier signal, the system could simply employ a carrier signal, with the receiver being adapted to provide an indication of the received carrier power. It has been found, however, that the tone-modulated carrier system as described above provides superior performance in terms of detection unambiguity.

Figure 7:
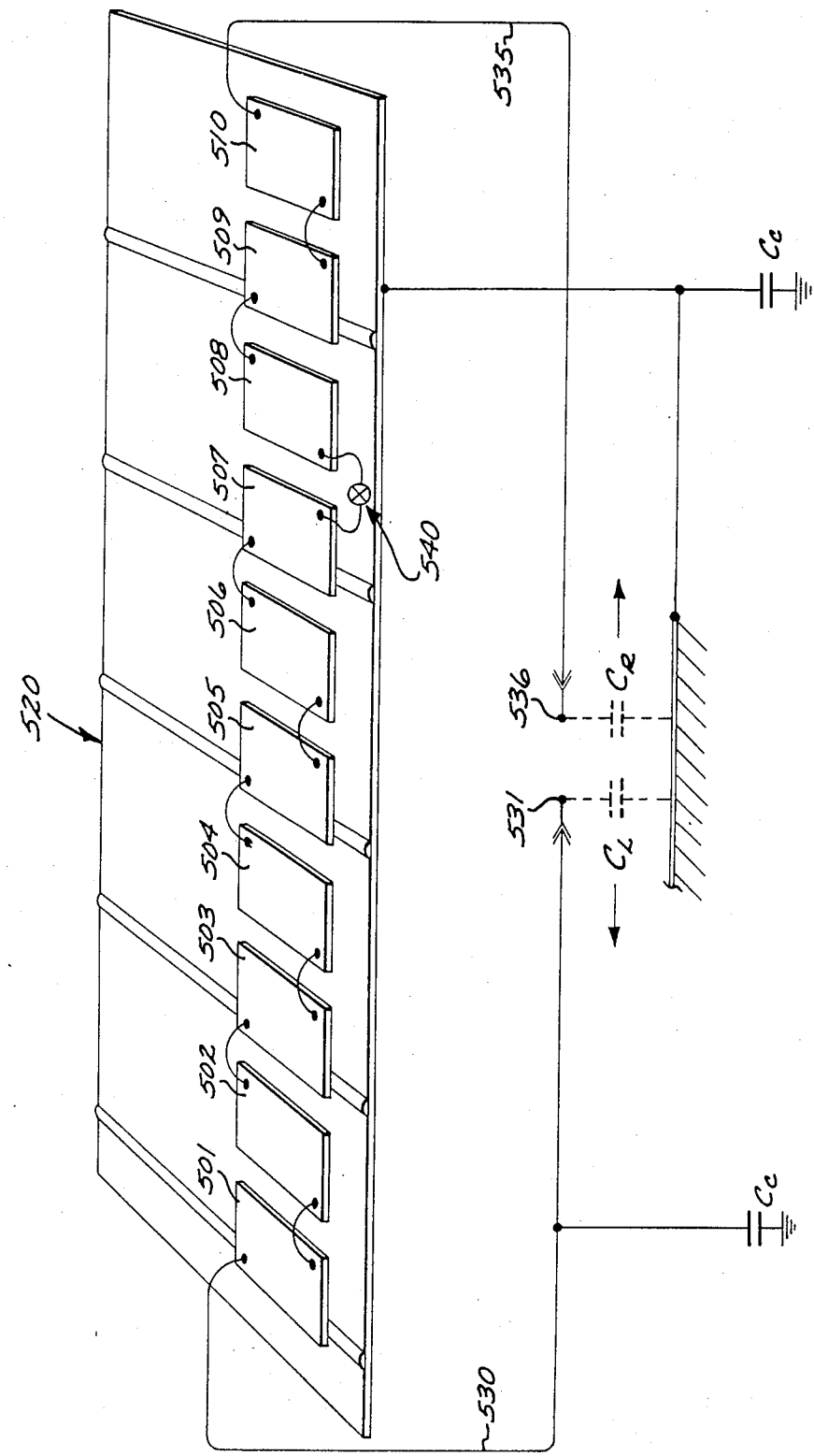
FIG. 7 is a general schematic illustration of a PV module string undergoing open fault detection in accordance with a system employing capacitive measurements.

In an alternate embodiment, the location of an open fault in a PV module string may be found by employing the comparative capacitance technique illustrated in FIG. 7. The technique is particularly well suited for PV module string installations in which the module array plane is disposed above a metal subroof which can act as an effective counterpoise. Such a counterpoise would provide a relatively high capacitance and fairly low impedance to ground.

In the comparative capacitance method, the capacitance of the module string is measured at the output termination, for example, by a digital capacitance meter. Comparison of this capacitance measurement with a known value for the string when fully operational provides an indication of the number of series-connected operable modules. The location of the open fault can thus be readily determined.

The comparative capacitance technique is explained in detail in connection with FIG. 7. A PV string comprising ten series-connected modules 501–510 is shown mounted adjacent a metallic ground plane 520 (the subroof). The modules are mounted to provide a separation distance D of five inches between the ground plane and the plane of each module. Each modules is two feet wide by four feet long, providing an area A of 1,152 square inches. Thus, the capacitance $C_M$ of each module, calculated using the relationship $C_M=(kA/D)(2248\times 10^{-4})$ picofarads, is about 50 picofarads neglecting the fringing capacitance, assuming the dielectric constant k for air is unity, and assuming that the capacity of the termination cables 530, 535 is about two picofarads per foot. With a total cable length of 150 feet, the cable capacity $C_C$ to ground is about 300 picofarads.

Because the capacitances are connected in parallel, the total capacitance of the string, measured either at the termination 531 of cable 530 (capacitance $C_L$) or at the termination 536 of cable 536 ($C_R$), is the sum of the cable capacity $C_C$ and the capacity of all the modules (10 times 50 picofarads) or 800 picofarads.

That sum assumes, of course, that there are no open faults in the module string. If, for illustration purposes, it is assumed that there is a break or open circuit 540 located in the cable connecting modules 507 and 508, the capacitance measurement $C_L$ at the termination 531 of cable 530 would be 650 picofarads and the capacitance measurement $C_R$ at the termination 536 of cable 535 would be 450 picofarads. Either measurement provides the information necessary to locate the fault, but it is preferable to take the measurement on the "hot" side of the string because that side is isolatable.

To use the alternate system, it is necessary to obtain calibration values for the capacitance of the string in a fault-free condition for each of the modules. The calibration values provide bench marks for comparison with the measurement taken when an open fault exists. The calibration values may be obtained (and retained), for example, at the time the PV system is installed.

An advantage of the alternate embodiment is that open fault detection can be performed without the need for the operator to have access to the PV modules, i.e., to walk on roof-mounted system.

It is understood that the above-described embodiments are merely illustrative of the many possible specific embodiments which can represent principles of the present invention. Numerous and varied other arrangements can be readily devised in accordance with these principles by those skilled in the art without departing from the spirit and scope of the invention. The exact nature and scope of the invention is defined in the following claims. For example, instead of amplitude modulating the carrier signal, other modulation techniques such as frequency modulation (fm), frequency-shift-keying modulation (fsk), or phase modulation (pm) could be employed to modulate a carrier with an information signal such as a toning or even a voice signal. The advantage of such fm or fsk techniques is that modulator power is not required, as in the case of amplitude modulation. Detection of the information signal typically is accomplished by a quadrature detector in the receiver.

What is claimed is:

1. Apparatus for detecting the location of open faults in a series-connected string of photovoltaic (PV) modules, comprising means for impressing rf test signals onto said module string at a predetermined location in the series-connected string, the frequency of said rf signals being selected in dependence on the reactive loss of said PV module string to be low enough that the string does not become an rf radiator, means for detecting the presence or absence of such rf signals, and probe means for coupling rf signals from successive positions adjacent said modules to said means for detecting such signals, said means for detecting the presence or absence of such rf signals further comprising means responsive to the absence of such detected signals for indicating the location of an open fault in the PV module string, the presence of such detected test signals indicating that continuity exists in the PV module string between said predetermined location and the position where said probe is disposed, and the absence of such detected signals indicating that the PV module string is open faulted between said probe and said predetermined location.

2. The apparatus of claim 1 wherein said means for impressing rf signals comprises an rf signal generator.

3. The apparatus of claim 2 wherein said generator comprises means for removably coupling the generator to the PV string.

4. The apparatus of claim 1 wherein the probe means comprises means for capacitively coupling the detecting means to selective positions in the PV module string.

5. The apparatus of claim 4 wherein the probe means comprises an electrode adapted to be movably positioned adjacent respective ones of the modules of the string.

6. The apparatus of claim 1 wherein said means for impressing an rf signal onto said module string comprises a generator for generating an rf carrier signal, and means for modulating the carrier signal with an audio signal.

7. The apparatus of claim 6 wherein said detector means comprises means for demodulating a modulated carrier signal.

8. The apparatus of claim 1 wherein the exposed surface of said modules is covered with glass and the frequency of said rf signals is in the range of 30 Khz to 450 Khz.

9. Apparatus for location of the position of open faults in a string of series-connected PV modules comprising:
an rf generator coupled to the PV module string for injecting an rf test signal into the string at a signal injection location, the frequency of said rf signal being selected in dependence on the reactive loss of said PV module string to be low enough that said module string does not become an rf radiator;
a portable rf receiver comprising means responsive to detected rf test signals for indicating continuity or lack of continuity in said module string between said signal injection location and particular probed locations in said module string and
a portable rf probe member comprising means for coupling rf signals to the receiver from said probed locations in the module string adjacent to said probe member.

10. The apparatus of claim 9 wherein the probe comprises an electrode plate adapted for movable disposition adjacent respective ones of the PV modules.

11. The apparatus of claim 10 wherein the rf generator comprises means for generating rf test signals modulated by an audio frequency signal, and the receiver comprises means for demodulating the audio frequency signal, and further comprises indication means responsive to said demodulated audio frequency signal for indicating reception of the rf signal injected into the module string.

12. The apparatus of claim 11 wherein said indicator means comprises audio speaker means for providing an audio indication of reception of the injected rf signal.

13. The apparatus of claim 9 wherein the exposed surface of said modules is covered with glass and the frequency of said rf signals is in the range of 30 Khz to 450 Khz.

14. A method for detecting the location of open faults in a series-connected string of photovoltaic (PV) modules, comprising the steps of (i) injecting a radio frequency (rf) test signal into the PV module string at an injection location, the frequency of said rf signal being selected in dependence on the reactive loss of the module string to be low enough that the module does not become an rf radiator, (ii) detecting the presence or absence of the rf test signal at successive probed locations adjacent the PV module string, (iii) employing the presence of said detected rf signal at a particular probed location to indicate that electrical continuity exists between said injection location and the particular location, and (iv) employing the absence of said detected rf signals at a particular probed location to indicate that an open fault exists between said injection location and said particular probed location.

15. The method of claim 14 wherein the detecting step comprises providing a receiver tuned to the frequency of the rf signal and successively positioning a probe electrode coupled to the receiver at successive locations adjacent the respective modules so as to detect the presence or absence of the rf signal.

16. The method of claim 15 wherein the rf signal injected into the module string is modulated by an audio frequency signal.

17. The method of claim 16 wherein the receiver comprises means for demodulating the audio frequency signal and means for indicating reception of the audio signal.

18. The method of claim 14 wherein the exposed surface of said modules is covered with glass and the frequency of said rf signals is in the range of 30 Khz to 450 Khz.

19. Apparatus for detecting the location of open faults in a series-connected photovoltaic (PV) module string, comprising:
   an rf signal generator comprising means for generating an rf carrier test signal which is amplitude modulated by an audio frequency signal, the frequency of said rf carrier being selected in dependence on the reactive loss of said PV module string to be low enough that the module string does not become an rf radiator;
   connection means for electrically connecting the rf signal generator to the module string to inject the modulated rf carrier into the module string at a signal injection location;
   detection means tuned to the frequency of the rf carrier and comprising demodulator means for demodulating the means responsive to the absence of said detected audio signals for indicating the location of an open fault in said module string, said means comprising an audio frequency signal, and audio transducer means coupled to the demodulator means for providing audio signals in response to the demodulator output so that audio signals indicating lack of detection of said audio signals indicate the location of an open fault in said PV module string; and
   portable probe means coupled to the detection means and comprising shielded electrode means adapted to capacitively couple rf signals to the detection means input when the electrode means is disposed adjacent a PV module of the string, whereby the audio signals provide an indication whether the rf signals have been conducted to the module adjacent the probe location to indicate the location of an open fault in said PV module string.

20. The apparatus of claim 19 wherein the exposed surface of said modules is covered with glass and the frequency of said rf signals is in the range of 30 Khz to 450 Khz.

21. Apparatus for locating open faults in a series-connected string of photovoltaic (PV) modules, comprising:
   transmitter means for injecting radio frequency (rf) electrical test signals into said module string at a signal injection point, the frequency of said rf signals being selected in dependence on the reactive loss of the PV module string to be low enough that the module string does not become an rf radiator;
   receiver means comprising means for detecting said rf signals and means responsive to the absence of such detected signals for indicating the location of an open fault; and
   coupling means for coupling the receiver to successive positions in said module string to detect the presence or absence of said rf signals at said successive positions along the modules string, the presence of said detected rf signals indicating that electrical continuity exists in that portion of said PV module string between said transmitter means and the position of said coupling means, and the absence of said detected rf signals indicating that an open fault exists in said portion of said PV module string.

22. The apparatus of claim 21 wherein said transmitter means comprises a generator for generating an rf carrier signal and modulating means for modulating the carrier signal with an audio signal, and wherein said receiver means comprises demodulating means for demodulating said audio signal.

23. The apparatus of claim 22 wherein said modulating means comprises means for demodulating the frequency of the rf carrier signal.

24. The apparatus of claim 22 wherein said modulating means comprises means for modulating the phase of the rf carrier signal.

25. The apparatus of claim 22 wherein said modulating means comprises means for modulating the amplitude of the rf carrier signal.

26. The apparatus of claim 21 wherein the exposed surface of said modules is covered with glass and the frequency of said rf signals is in the range of 30 Khz to 450 Khz.

* * * * *